United States Patent
Püschner et al.

(10) Patent No.: US 9,324,642 B2
(45) Date of Patent: Apr. 26, 2016

(54) METHOD OF ELECTRICALLY ISOLATING SHARED LEADS OF A LEAD FRAME STRIP

(71) Applicant: Infineon Technologies AG, Neubiberg (DE)

(72) Inventors: Frank Püschner, Kelheim (DE); Bernhard Schätzler, Regensburg (DE); Teck Sim Lee, Melaka (MY); Franz Gabler, Lappersdorf (DE); Pei Pei Kong, Melaka (MY); Boon Huat Lim, Muar (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/077,582

(22) Filed: Nov. 12, 2013

(65) Prior Publication Data
US 2015/0130037 A1    May 14, 2015

(51) Int. Cl.
| | | |
|---|---|---|
| *H01L 23/495* | (2006.01) | |
| *H01L 21/48* | (2006.01) | |
| *H01L 23/00* | (2006.01) | |
| *H01L 21/66* | (2006.01) | |
| *H01L 21/56* | (2006.01) | |
| *H01L 23/31* | (2006.01) | |

(52) U.S. Cl.
CPC ...... *H01L 23/49541* (2013.01); *H01L 21/4825* (2013.01); *H01L 21/4828* (2013.01); *H01L 23/49575* (2013.01); *H01L 23/49582* (2013.01); *H01L 24/97* (2013.01); *H01L 21/561* (2013.01); *H01L 22/14* (2013.01); *H01L 23/3107* (2013.01); *H01L 2924/12042* (2013.01); *H01L 2924/181* (2013.01)

(58) Field of Classification Search
USPC .......................... 438/106–127; 257/666–677
See application file for complete search history.

(56) References Cited

U.S. PATENT DOCUMENTS

| | | | |
|---|---|---|---|
| 5,599,413 A | 2/1997 | Nakao et al. | |
| 6,573,121 B2 | 6/2003 | Yoneda et al. | |
| 7,087,461 B2 | 8/2006 | Park et al. | |
| 8,551,820 B1 | 10/2013 | Foster et al. | |
| 2005/0110010 A1 | 5/2005 | Winter et al. | |
| 2005/0214980 A1* | 9/2005 | Shiu et al. ..................... | 438/123 |
| 2005/0218499 A1 | 10/2005 | Chang et al. | |
| 2005/0287709 A1* | 12/2005 | Lee et al. ..................... | 438/122 |
| 2006/0231937 A1 | 10/2006 | Juskey et al. | |
| 2007/0092991 A1 | 4/2007 | Masumoto | |

(Continued)

FOREIGN PATENT DOCUMENTS

TW    461057 B    10/2001

*Primary Examiner* — Mohammad Islam
*Assistant Examiner* — Mikka Liu
(74) *Attorney, Agent, or Firm* — Murphy, Bilak & Homiller, PLLC

(57) ABSTRACT

A lead frame strip includes a plurality of connected unit lead frames, each unit lead frame having a die paddle and a plurality of leads connected to a periphery of the unit lead frame. A semiconductor die is attached to the die paddles. A molding compound covers the unit lead frames, including the semiconductor dies. Prior to testing or other processing of the lead frame strip, a gap is etched into a region of the leads which are shared by adjacent ones of the unit lead frames. The gap extends at least mostly through the shared leads. A partial cut is made in the molding compound around the periphery of the unit lead frames prior to the subsequent processing, including below the gap in the shared leads, to electrically isolate the leads of the unit lead frames.

20 Claims, 14 Drawing Sheets

(56) References Cited

U.S. PATENT DOCUMENTS

| | | |
|---|---|---|
| 2007/0161157 A1 | 7/2007 | Islam et al. |
| 2007/0184658 A1 | 8/2007 | Koyata et al. |
| 2008/0188015 A1 | 8/2008 | Sangaunwong et al. |
| 2008/0254392 A1 | 10/2008 | Yang et al. |
| 2010/0003894 A1 | 1/2010 | Miller et al. |
| 2012/0252142 A1 | 10/2012 | Abbott |
| 2012/0274014 A1 | 11/2012 | Byars et al. |
| 2012/0306065 A1 | 12/2012 | Bin Mohd Arshad |
| 2013/0120019 A1 | 5/2013 | Gibbs et al. |
| 2014/0035113 A1 | 2/2014 | Kierse |
| 2015/0064849 A1 | 3/2015 | Khoo et al. |

\* cited by examiner

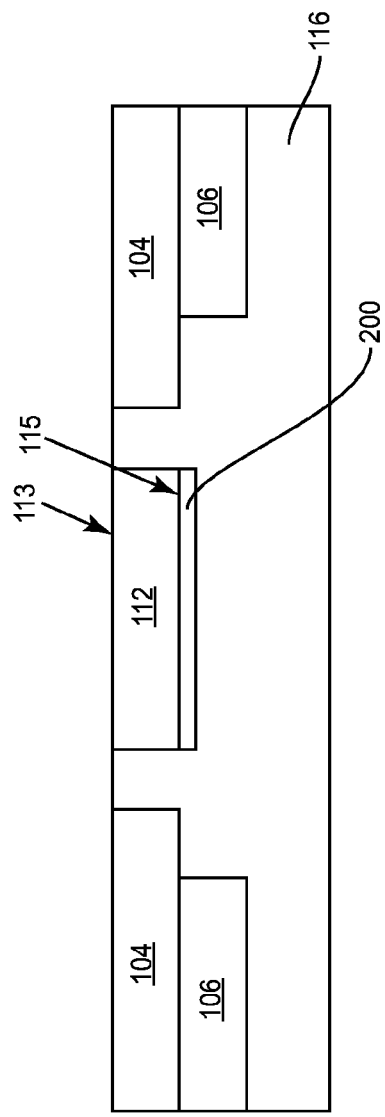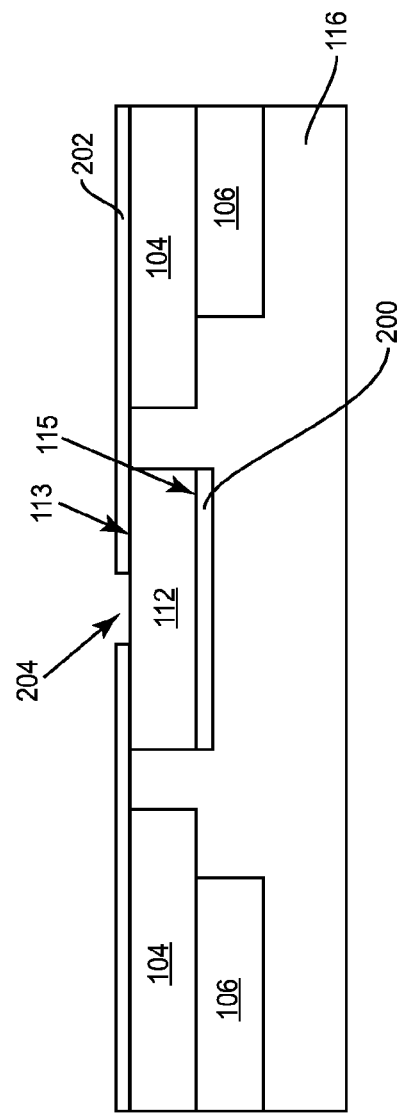

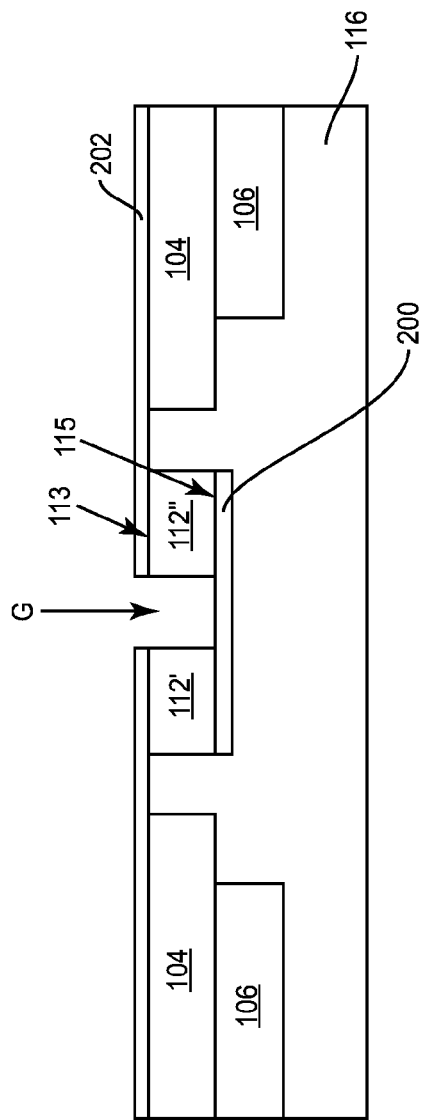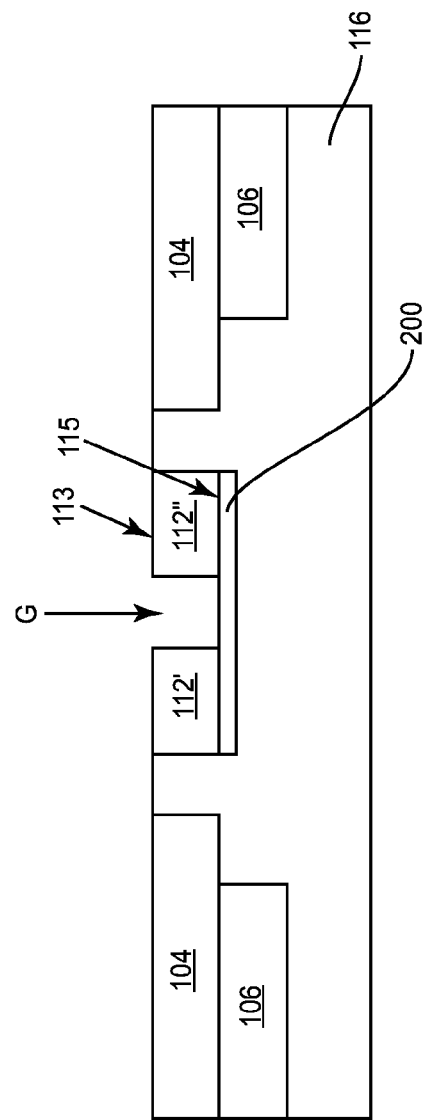

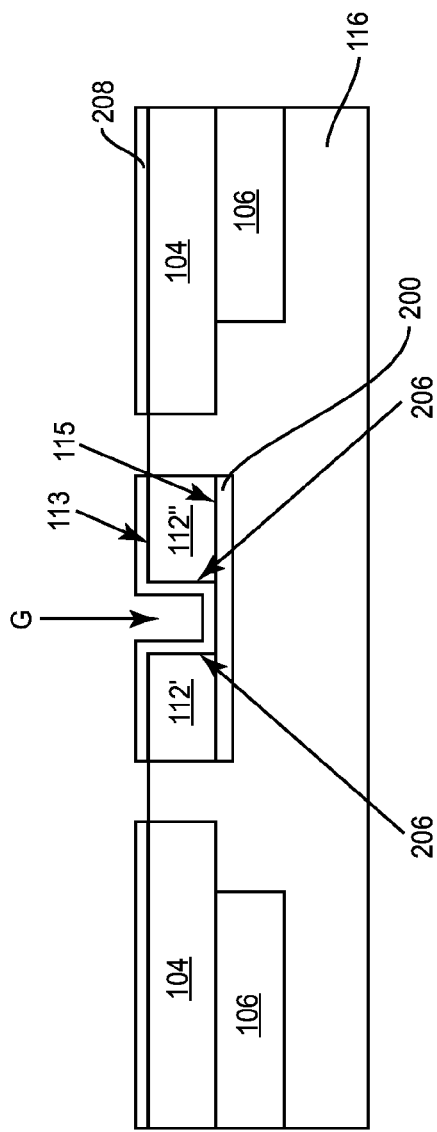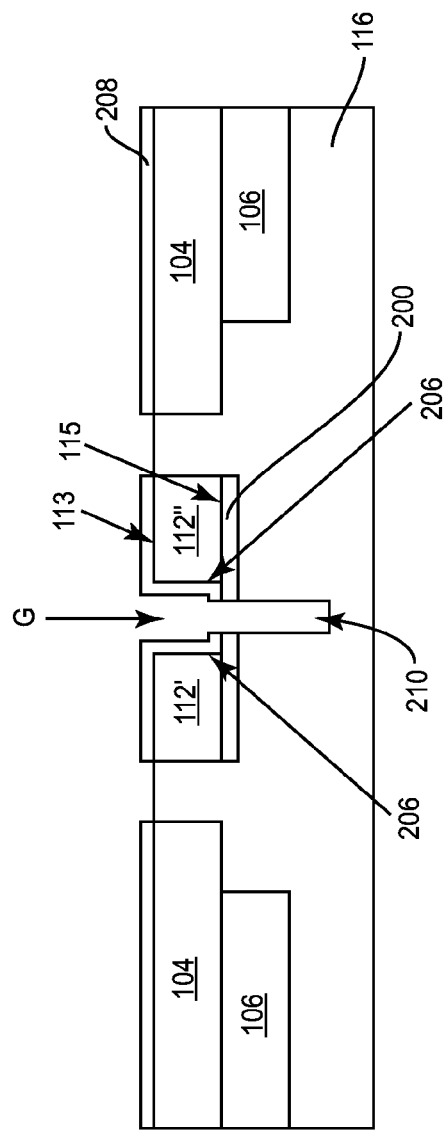

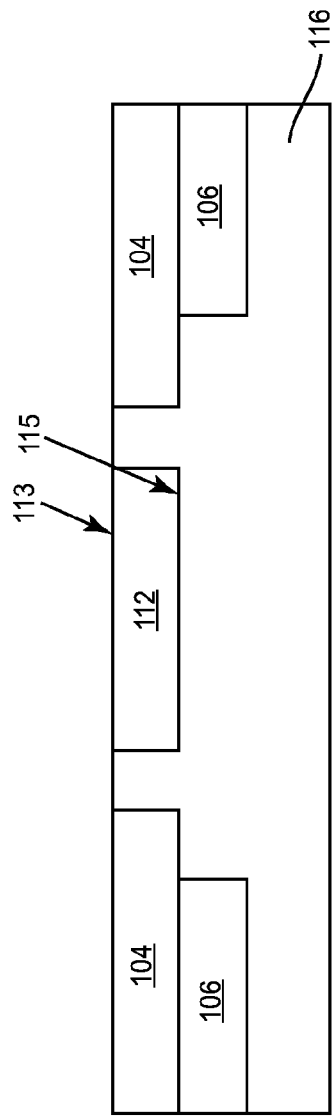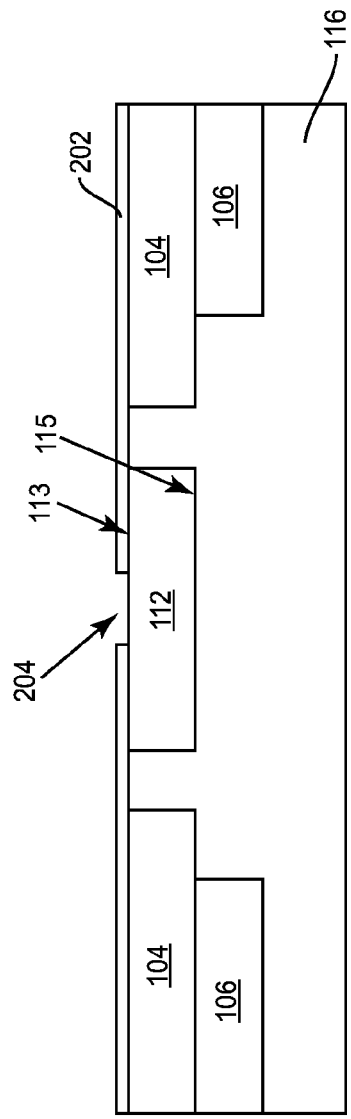

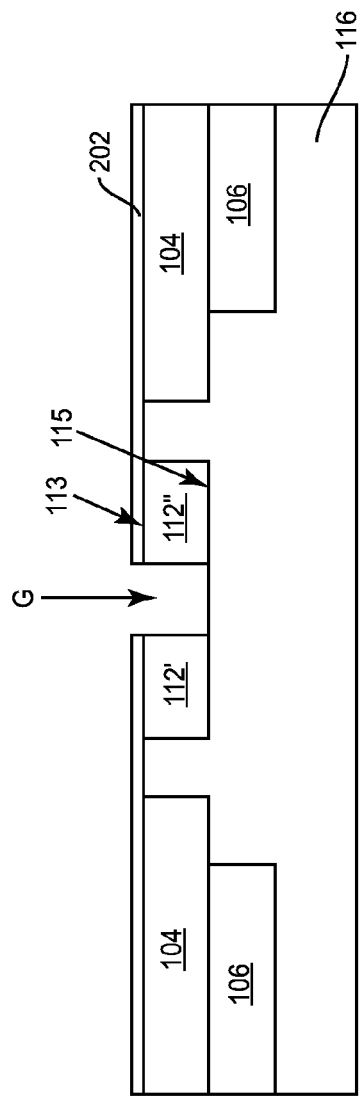
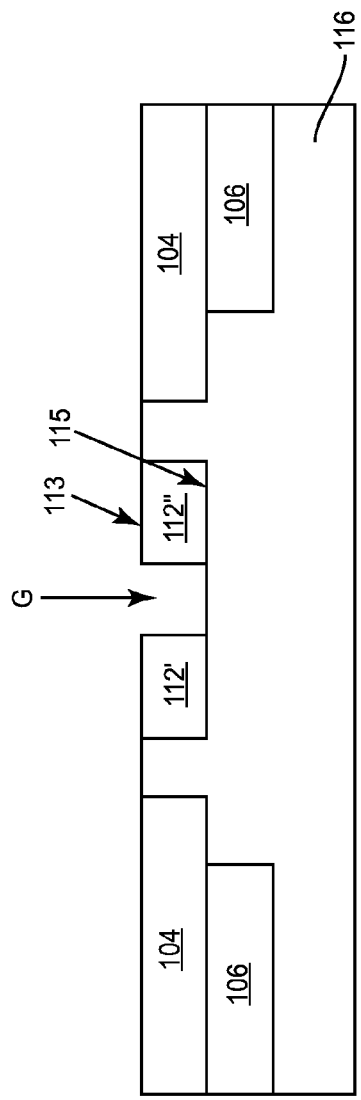

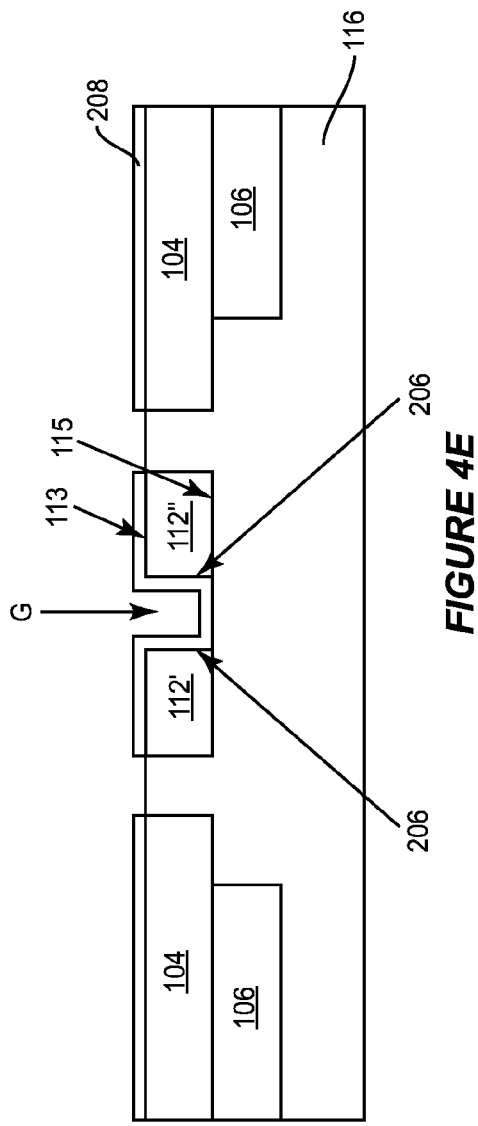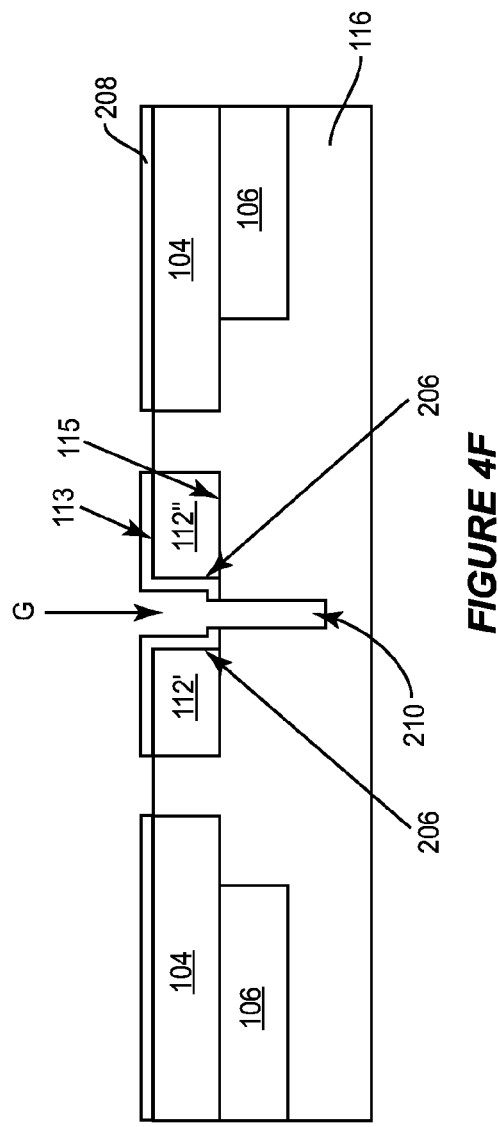

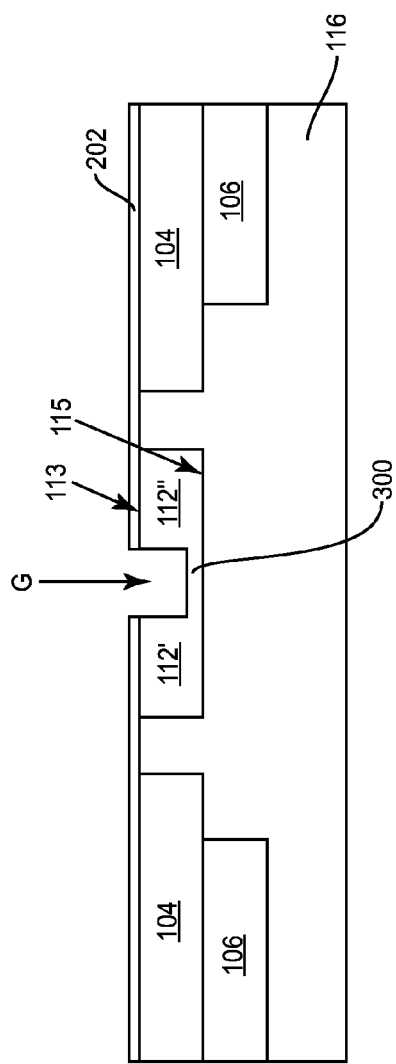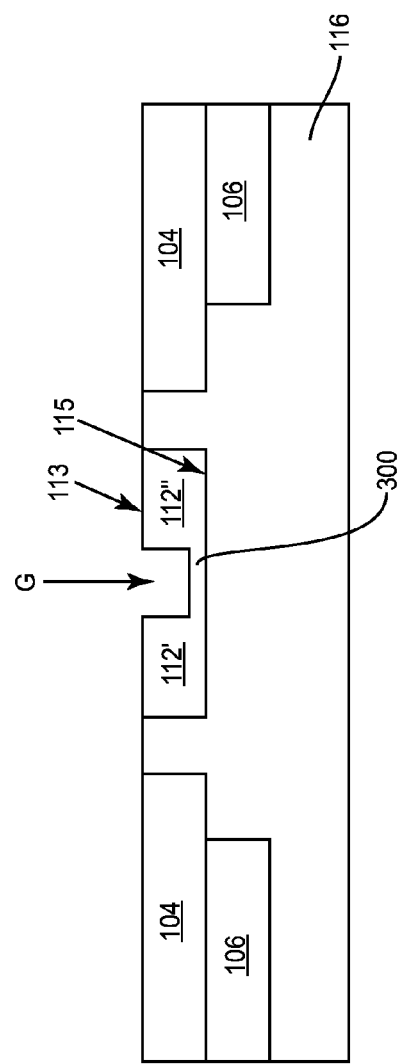

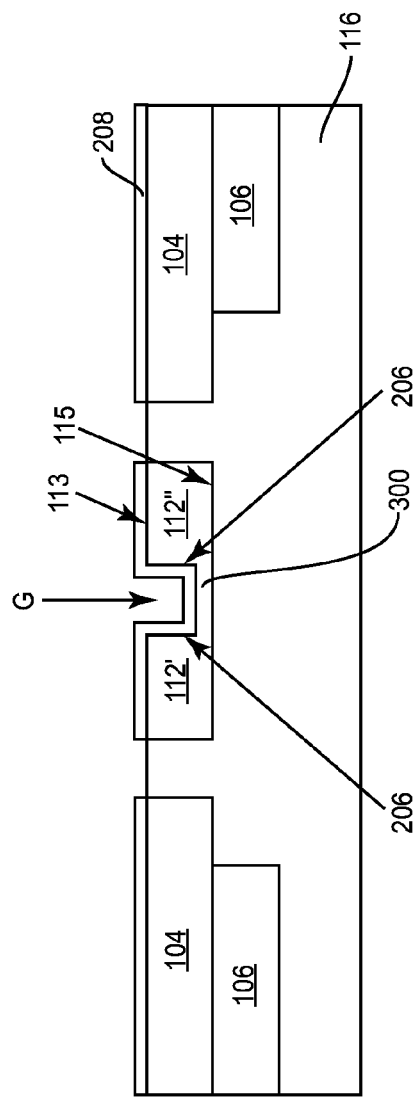
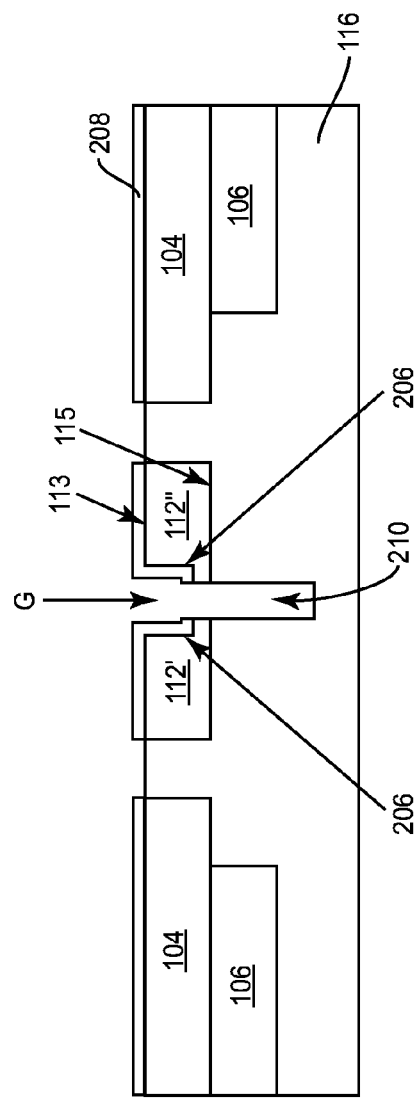

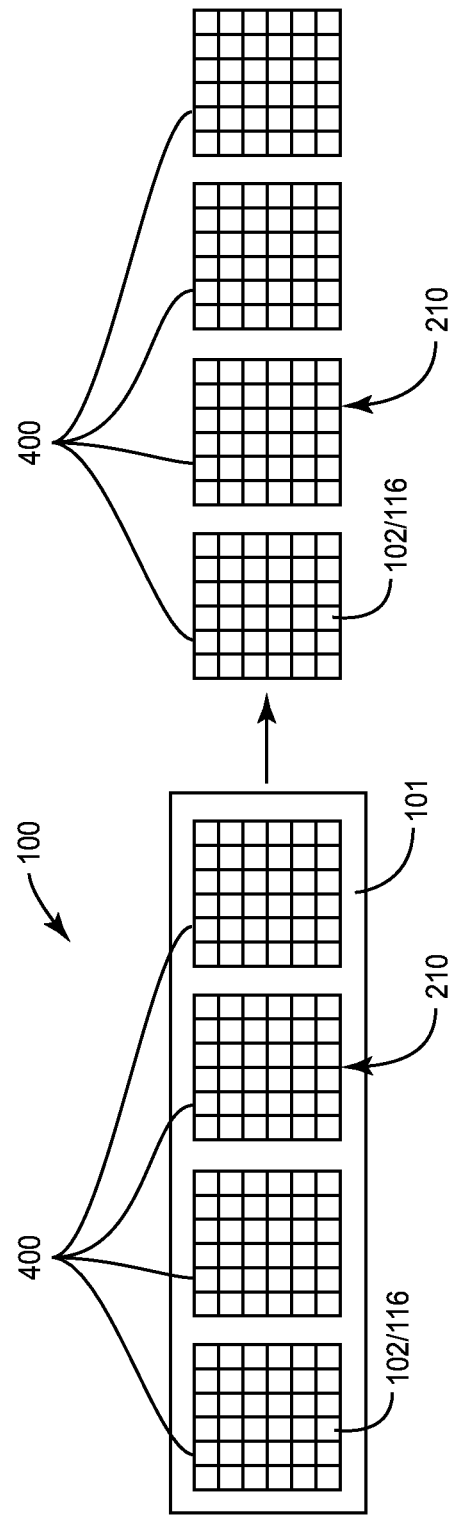

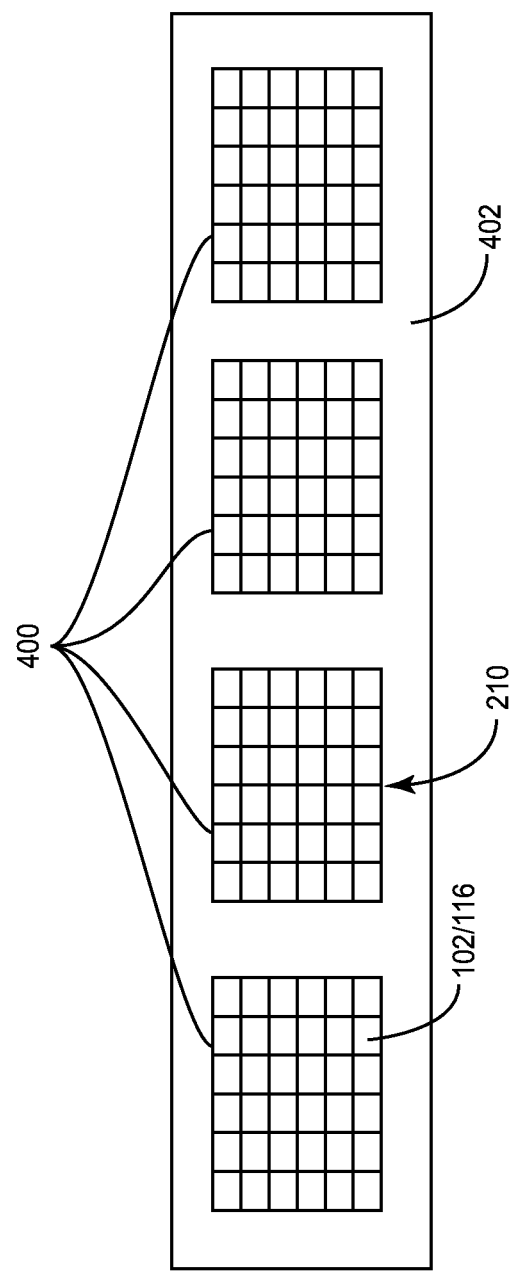

METHOD OF ELECTRICALLY ISOLATING SHARED LEADS OF A LEAD FRAME STRIP

TECHNICAL FIELD

The instant application relates to lead frame strips, and more particularly to electrical isolation of shared leads of a lead frame strip during lead frame strip processing.

BACKGROUND

A lead frame forms the base or skeleton of an IC package, providing mechanical support to semiconductor dies during assembly into a finished package. A lead frame typically includes a die paddle for attaching a semiconductor die, and leads providing the means for external electrical connection to the die. The die can be connected to the leads by wires, e.g. through wire bonding or tape automated bonds. Lead frames are typically constructed from flat sheet metal, e.g. by stamping or etching. The sheet metal is typically exposed to chemical etchants that remove areas not covered by photoresist. After the etching process, the etched frames are singulated (separated) into lead frame strips. Each lead frame strip includes a number of unit lead frames each having the die paddle and lead construction described above.

Semiconductor dies attached to the die paddles after completion of the assembly process of a lead frame strip are usually tested after separation of the unit lead frames from the lead frame strip, e.g. by punching. Alternatively, the unit lead frames remain mechanically connected to the lead frame strip by tie bars during die testing. This is commonly referred to as lead frame strip testing. Separation of the individual unit lead frames from the lead frame strip occurs after electrical testing. However, the devices must be electrically isolated from one another prior to lead frame strip testing to ensure proper device testing.

Some types of conventional processing involve sawing about half-way through the periphery of each unit lead frame, including through the metal leads, to sever the leads and so that a thin part of molding compound remains intact in the periphery to hold the units in place during lead frame strip testing. However, such processing increases wearing of the sawing blade which can cause inaccuracy. Also, sawing through the metal leads to provide electrical isolation can cause smearing of the metal material which is particularly the case for copper leads. As such longer cycle times are needed to saw through the leads prior to lead frame strip testing, increasing the cost of the individual packages produced from the lead frame strip.

In other conventional approaches, a metal carrier is provided which has an upper surface including an encapsulating matrix with a plurality of sawing lines. A plurality of bump pads and a plurality of die pads are formed on the upper surface of the metal carrier by plating. Semiconductor dies are attached to the corresponding die pads and a plurality of bonding wires connect the bonding pads on the active surfaces of the chips to the bump pads. A square encapsulant covers the encapsulating matrix including the sawing lines and the chips. After etching away the metal carrier, the bump pads and the die pads are exposed from the bottom surface of the encapsulant. Even though the sawing process is done through only the encapsulant and not metal, the cost of the lead frame strip significantly increases by adding the plurality of bumps and die pads, which are formed on the upper surface of the metal carrier by plating. In addition, to form a plurality of encapsulants per single package, lead frame cost further increase as a result of lower material utilization because of larger lateral package size (i.e. encapsulant overhang).

SUMMARY

A lead frame strip includes a plurality of connected unit lead frames, each unit lead frame having a die paddle and a plurality of leads connected to a periphery of the unit lead frame. According to an embodiment of a method of processing the lead frame strip, the method comprises: attaching a semiconductor die to the die paddles; covering the unit lead frames including the semiconductor dies with a molding compound; forming a mask on a side of the die paddles and the leads uncovered by the molding compound, the mask having openings exposing a region of the leads which are shared by adjacent ones of the unit lead frames; etching the exposed region of the shared leads to separate the shared leads by a gap which extends at least mostly through the shared leads; cutting partly through the molding compound around the periphery of the unit lead frames, including below the gap in the shared leads, to electrically isolate the leads of the unit lead frames; and processing the lead frame strip after cutting partly through the molding compound.

According to an embodiment of lead frame strip, the lead frame strip comprises a plurality of connected unit lead frames, each unit lead frame having a die paddle and a plurality of leads connected to a periphery of the unit lead frame. The lead frame strip further comprises a semiconductor die attached to the die paddles, a molding compound covering the unit lead frames including the semiconductor dies, and a gap etched into a region of the leads which are shared by adjacent ones of the unit lead frames. The gap extends at least mostly through the shared leads. The lead frame strip also comprises a partial cut in the molding compound around the periphery of the unit lead frames, including below the gap in the shared leads, which electrically isolates the leads of the unit lead frames.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3, which includes FIGS. 3A through 3G, illustrates different stages of an embodiment of a method of processing a lead frame strip.

FIG. 4, which includes FIGS. 4A through 4F, illustrates different stages of another embodiment of a method of processing a lead frame strip.

FIG. 5, which includes FIGS. 5A through 5F, illustrates different stages of yet another embodiment of a method of processing a lead frame strip.

FIG. 6, which includes FIGS. 6A and 6B, illustrates different stages of an embodiment of a method of lead frame strip testing.

DETAILED DESCRIPTION

According to embodiments described herein, leads which are shared by adjacent unit lead frames of a lead frame strip are completely or at least mostly etched through to form a gap between the shared leads. In some cases, a thin layer of the shared leads or other metal material used in the processing of the lead frame strip can remain below the gap etched in the shared leads. This thin metal layer can be easily cut through using a sawing blade which cuts partly into the molding compound around the periphery of the unit lead frames to ensure electrical isolation of the leads. The molding compound encapsulating the unit lead frame remains at least partly intact around the periphery of the unit lead frames to provide rigidity to the lead frame strip during subsequent processing such as lead frame strip testing, partial plating, electrical charging, etc. The unit lead frames are later separated from the lead frame strip into individual packages.

Figure 1:
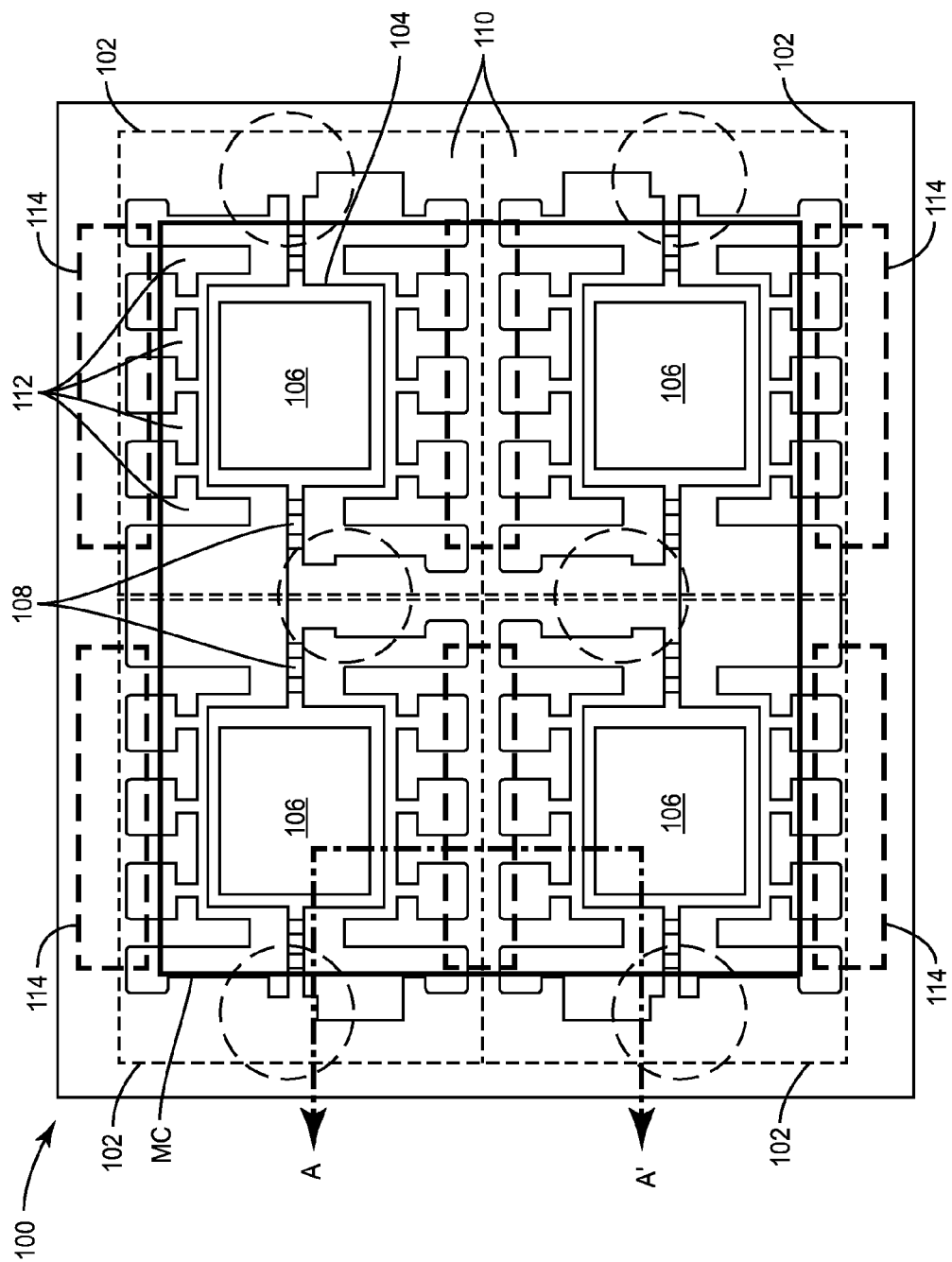
FIG. 1 illustrates a plan view of a lead frame strip with regions of shared leads targeted for etching as part of an electrical isolation process for the unit lead frames of the lead frame strip, according to an embodiment.

FIG. 1 illustrates a top plan view of part of a lead frame strip 100 according to an embodiment. The lead frame strip 100 includes a plurality of connected unit lead frames 102, four of which are shown in FIG. 1. Each unit lead frame 102 has a die paddle 104 for attaching one or more semiconductor dies 106, tie bars 108 connecting the die paddle 104 to the periphery 110 of the unit lead frame 102, and a plurality of leads 112 projecting from the periphery 110 toward the die paddle 104. The die paddles 104 and leads 112 can comprise any standard lead frame metal such as an iron nickel alloy, copper, etc.

In one embodiment, the lead frame strip 100 is constructed from flat sheet metal, e.g. by stamping or etching. For example, the sheet metal can be exposed to chemical etchants that remove areas not covered by photoresist. Other processing can be performed, e.g. laser etching to pattern the sheet metal. After the patterning process, the patterned frames are singulated (separated) into lead frame strips. One such lead frame strip 100 is shown in FIG. 1.

Electrical connections (not shown for ease of illustration) are formed between the leads 112 of each unit lead frame 102 and terminals of the semiconductor dies 106 attached to the die paddles 104. The unit lead frames 102 and the semiconductor dies 106 are then encapsulated with a molding compound to form individual packages. The regions of the lead frame strip 100 to be covered by molding compound are labeled 'MC' in FIG. 1. Any standard molding compound available in the semiconductor packaging arts can be used.

Figure 2:
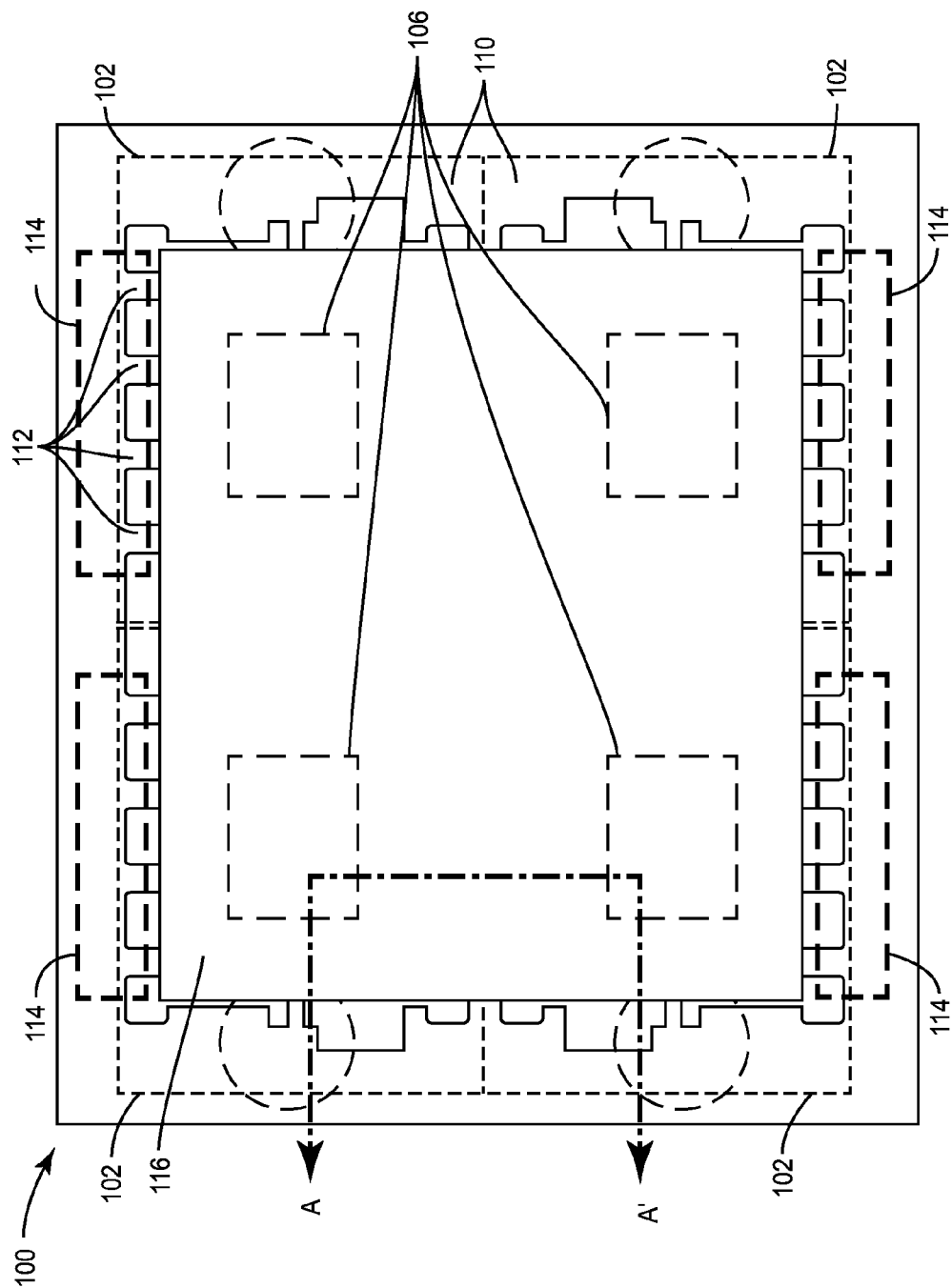
FIG. 2 illustrates a plan view of the lead frame strip of FIG. 1 after molding.

FIG. 2 shows the lead frame strip 100 after the semiconductor dies 106 are attached to the die paddles 104 and a molding compound 116 covers the unit lead frames 102 including the dies 106. The dies 106 are represented by dashed boxes in FIG. 2 since the dies 106 are covered by the molding compound 116. More than one die paddle 104 can be included in each individual package, and the individual packages are later physically separated into individual units.

Prior to testing of the semiconductor dies 106 attached to the die paddles 104 or other processing such as partial plating, electrical charging, etc., the leads 112 which are shared by adjacent ones of the unit lead frames 102 are etched followed by a sawing process to electrically isolate the leads 112 of each unit lead frame 102 for subsequent processing. The etching process completely or at least mostly separates the shared leads 112 so that little or no lead metal is cut by the sawing process. The regions of the shared leads 112 to be etched are labeled 114 in FIG. 2.

Figure 3G:
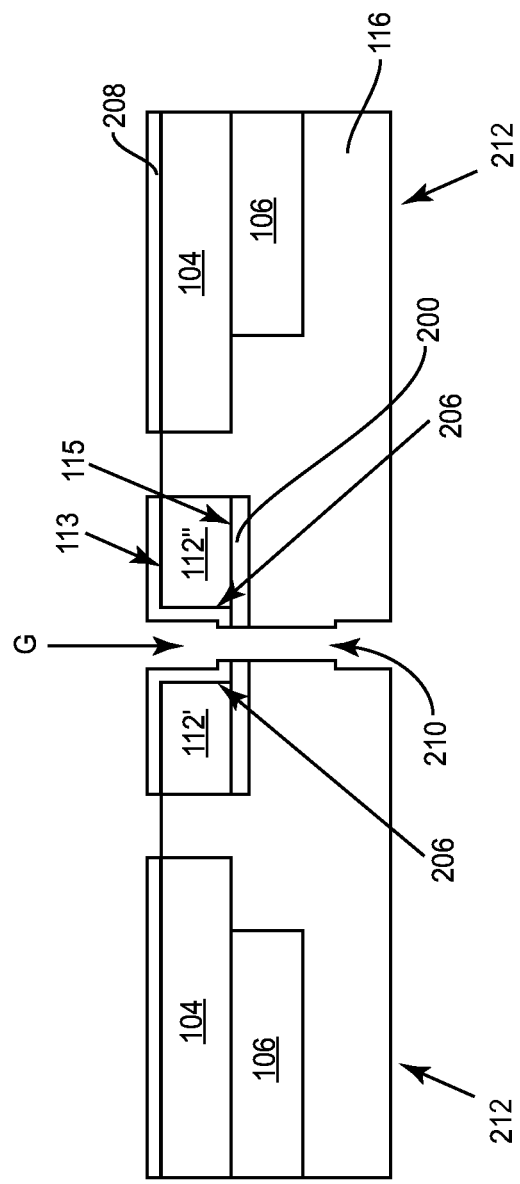

FIG. 3, which includes FIGS. 3A through 3G, illustrates cross-sectional views of the lead frame strip 100 taken along the line labeled A-A' in FIGS. 2 and 3 during different stages of a method of processing the lead frame strip.

FIG. 3A shows the lead frame strip 100 in a region where a lead 112 is shared by adjacent unit lead frames 102 e.g. in any of the regions labeled 114 in FIG. 1, after the unit lead frames 102 including the semiconductor dies 106 are covered with a molding compound 116. Each shared lead 112 has a first side 113 uncovered by the molding compound 116 and an opposing second side 115 covered by the molding compound 116. An etch stop layer 200 is applied to the second side 115 of the shared leads 112 of the lead frame strip 100 prior to molding. The etch stop layer 200 is resistant to the subsequent etching of the shared leads 112. In one embodiment, the etch stop layer 200 is a plated electrically conductive e.g. silver, gold, palladium, etc.

FIG. 3B shows the shared lead region of the lead frame strip 100 after a photolithography (etch) mask 202 is formed on the side 113 of the die paddles 104 and the leads 112 uncovered by the molding compound 116. The mask 202 has openings 204 exposing a region of the leads 112 which are shared by adjacent ones of the unit lead frames 102. Any standard photolithography (etch) mask available in the semiconductor packaging arts can be used.

FIG. 3C shows the shared lead region of the lead frame strip 100 after the exposed region of the shared leads 112 is etched to separate each shared lead 112 by a gap (G) which extends at least mostly through the shared leads 112. According to the embodiment shown in FIG. 3, the etch stop layer 200 on the second side 115 of the shared leads 112 is resistant to etching. The etching process is stopped after the etch stop layer 200 is exposed so that the gap G extends completely through the shared leads 112 to physically separate each of the shared leads 112 into at least two different sections 112', 112". The sections 112', 112" of the same shared lead 112 remain connected below the gap G by the etch stop layer 200 upon completion of the etching. The etch stop layer 200 can be electrically conductive as explained above, so that the sections 112', 112" of each shared lead 112 remain electrically connected below the gap by the etch stop layer 200 upon completion of the etching. Any standard etching process available in the semiconductor packaging arts can be used to form the gap G in the shared leads 112.

FIG. 3D shows the shared lead region of the lead frame strip 100 after the photolithography (etch) mask 202 is removed from the side 113 of the die paddles 104 and leads 112 uncovered by the molding compound 116. Any standard mask removal process available in the semiconductor packaging arts can be used to remove the mask 202.

FIG. 3E shows the shared lead region of the lead frame strip 100 after plating the side 113 of the die paddles 104 and the leads 112 uncovered by the molding compound 116, plating the sidewalls 206 of the shared lead sections 112', 112" exposed by the etching, and plating the etch stop layer 200 at the bottom of the gap G. Any standard galvanic plating process available in the semiconductor packaging arts can be employed if the etch stop layer 200 is a metal e.g. such as silver, gold, palladium, etc. to form the plating 208.

FIG. 3F shows the shared lead region of the lead frame strip 100 after cutting partly through the molding compound 116 around the periphery of the unit lead frames 102, including below the gap G in the shared leads 112, to form a slot 210 in the molding compound 116. This includes cutting through the plating 208 and the etch stop layer 200 below the gap G in the shared leads 112. After the cutting, the leads 112 of the unit lead frames 102 are electrically isolated and remain covered on all sides to prevent corrosion or oxidation. For example, the bottom side 115 of the shared lead sections 112', 112" is covered by the etch stop layer 200, one or more lateral sides 206 of the shared lead sections 112', 112" are covered by the molding compound 116 and the top side 113 and one or more different lateral sides 206 of the shared lead sections 112', 112" are covered by the plating 208. The cutting process shown in FIG. 3F can be performed by any standard sawing or laser cutting process available in the semiconductor packaging arts. The lead frame strip 100 is then subjected to additional processing such as lead frame strip testing, partial plating, electrical charging, etc.

FIG. 3G shows the shared lead region of the lead frame strip 100 after additional processing and after the unit lead frames 102 are separated into individual packages 212. According to one embodiment, a standard sawing or laser cutting process is employed to cut completely through the slot 210 in the molding compound 116 around the periphery of the unit lead frames 102, including below the gap G in the shared leads 112, to separate the unit lead frames 102 into individual packages 212. According to another embodiment, the molding compound 116 is broken around the periphery of the unit lead frames 102 e.g. using a breaking bar aligned with the slot 210 in the molding compound, to separate the unit lead frames 102 into individual packages 212. In each case, the plating 208 remains intact along the side 113 of the die paddles 104 and the leads 112 uncovered by the molding compound 116 and along the sidewalls 206 of the shared lead sections 112', 112", after cutting or breaking the molding compound 116. As such, a subsequent passivation layer is not needed to protect the leads 112.

FIG. 4, which includes FIGS. 4A through 4F, illustrates cross-sectional views of the lead frame strip 100 taken along the line labeled A-A' in FIGS. 2 and 3 during different stages of a method of processing the lead frame strip according to another embodiment.

FIG. 4A shows the lead frame strip 100 in a region where a lead 112 is shared by adjacent unit lead frames 102 e.g. in any of the regions labeled 114 in FIG. 1, after the unit lead frames 102 including the semiconductor dies 104 are covered with a molding compound 116. Each shared lead 112 has a first side 113 uncovered by the molding compound 116 and an opposing second side 115 covered by the molding compound 116. Different from the embodiment shown in FIG. 3A, no etch stop layer is applied to the second side 115 of the shared leads 112 of the lead frame strip 100 prior to molding. Instead, the molding compound 116 directly contacts the second side 115 of the shared leads 112.

FIG. 4B shows the shared lead region of the lead frame strip 100 after a photolithography (etch) mask 202 is formed on the side 113 of the die paddles 104 and leads 112 uncovered by the molding compound 116 as previously described herein with regard to FIG. 3B. The mask 202 has openings 204 exposing a region of the leads 112 which are shared by adjacent ones of the unit lead frames 102.

FIG. 4C shows the shared lead region of the lead frame strip 100 after the exposed region of the shared leads 112 is etched to separate each shared lead 112 by a gap (G) which extends completely through the shared leads 112. Different than the embodiment shown in FIG. 3C, the etching process is controlled to stop when all of the lead material is removed in the gap, exposing the underlying molding compound 116.

FIG. 4D shows the shared lead region of the lead frame strip 100 after the photolithography (etch) mask 202 is removed from the side 113 of the die paddles 104 and leads 112 uncovered by the molding compound 116 as previously described herein with regard to FIG. 4B.

FIG. 4E shows the shared lead region of the lead frame strip 100 after plating the side 113 of the die paddles 104 and leads 112 uncovered by the molding compound 116, plating the sidewalls 206 of the shared lead sections 112', 112" exposed by the etching, and plating the molding compound 116 at the bottom of the gap G between the sections 112', 112" of the shared lead 112. Different from the embodiment shown in FIG. 3E, any standard electroless plating i.e. electroless chemical deposition process available in the semiconductor packaging arts can be employed to form the plating 208 since there is no metal etch stop layer and the molding compound 116 at the bottom of the gap G between the sections 112', 112" of the shared lead 112 is to be plated to protect the exposed sidewalls 206 of the lead sections 112', 112".

FIG. 4F shows the shared lead region of the lead frame strip 100 after cutting partly through the molding compound 116 around the periphery of the unit lead frames 102, including below the gap G in the shared leads 112, to form a slot 210 in the molding compound 116. After the cutting, the leads 112 of the unit lead frames 102 are electrically isolated and remain covered on all sides to prevent corrosion or oxidation as previously described herein with regard to FIG. 3F. Different than the embodiment shown in FIG. 3F, the bottom side 115 of the shared leads 112 is directly contacted by the molding compound 116 instead of an etch stop layer. The lead frame strip 100 is then subjected to additional processing such as lead frame strip testing, partial plating, electrical charging, etc. and the unit lead frames separated into individual packages as previously described herein with regard to FIG. 3G.

Figure 5A:
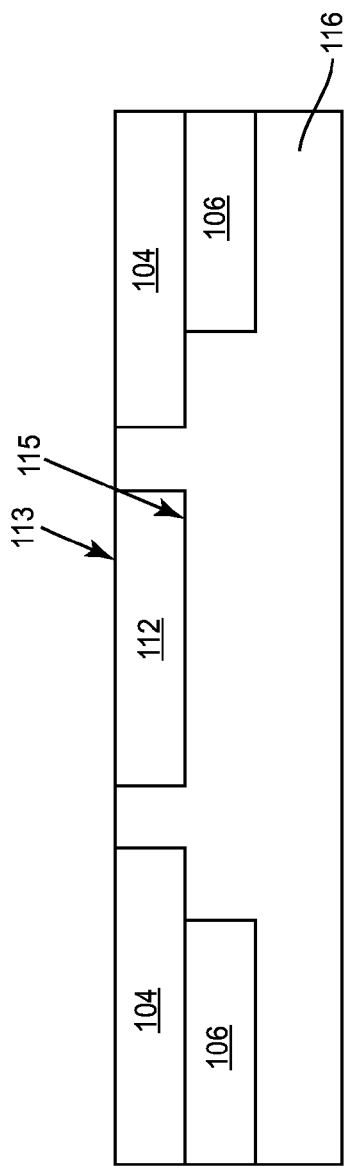
Figure 5B:
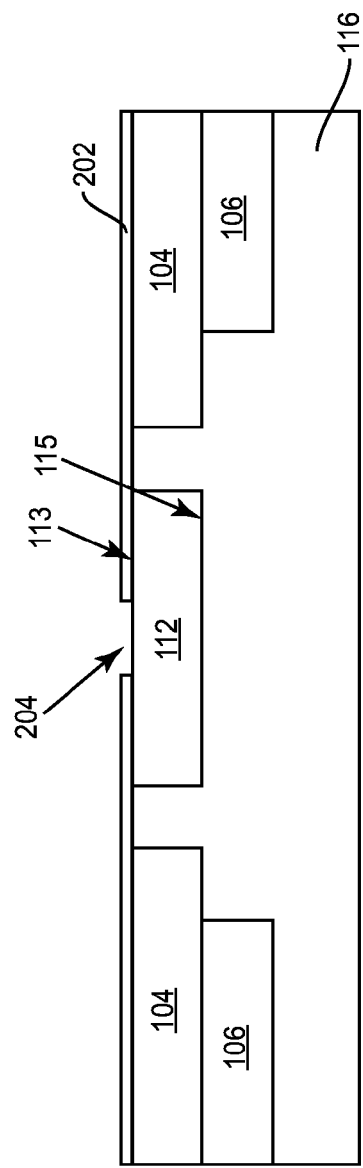

FIG. 5, which includes FIGS. 5A through 5F, illustrates cross-sectional views of the lead frame strip 100 taken along the line labeled A-A' in FIGS. 2 and 3 during different stages of a method of processing the lead frame strip 100 according to yet another embodiment. FIGS. 5A through 5F are identical to FIGS. 4A through 4F, except that the etching of the shared leads 112 is stopped so that between 1 µm and 5 µm of the shared leads 112 remains intact below the gap G in the leads 112 upon completion of the etching and prior to cutting partly through the molding compound 116. This residual thin layer 300 connecting the sections 112', 112" of each shared lead 112 below the gap G is later cut e.g. by sawing or laser cutting to electrically isolate the shared leads 112 of the unit lead frames 102. If sawing is employed, the sawing blade experiences minimal additional wear by cutting through this connecting layer 300 below the gap G in the shared leads 112, since the connecting layer 300 is so thin.

In some embodiments, groups of the unit lead frames 102 can be molded as individual molded units by covering each of the molded units with the molding compound 116.

FIG. 6, which includes FIGS. 6A and 6B, illustrates different top down plan views of an embodiment of a plurality of individual molded units 400 produced from the lead frame strip 100. Each molded unit 400 includes a plurality of the unit lead frames 102 as previously described herein. The shared lead etching and molding compound partial cutting processes previously described herein have been performed, as indicated by the cuts 210 formed in the molded units 400. Each cut box 210 demarcates one of the unit lead frames 102 with the leads 112 electrically isolated from the other unit lead frames 102 included in the same molded unit 400. Subsequent processing of the lead frame strip 100 can include removing the molded units 400 from the periphery 101 of the lead frame strip 100 after forming the partial cuts 210 in the molding compound 116 as shown in FIG. 6A. The molded units 400 are then placed on a support substrate 402 after removal from the periphery 101 of the lead frame strip 100 as shown in FIG. 6B. One or more groups of the semiconductor dies 106 are tested in parallel after the molded units 400 are placed on the support substrate 402. For example, all of the semiconductor dies 106 included in the same molded unit 400 can be tested in parallel or subsets of these dies 106 can be tested in parallel. The number of dies 106 tested in parallel depends on the type and configuration of lead frame strip testing equipment employed.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a lead frame strip including a plurality of connected unit lead frames, each unit lead frame having a die paddle and a plurality of leads connected to a periphery of the unit lead frame, the method comprising:
    attaching a semiconductor die to each of the die paddles;
    covering the plurality of connected unit lead frames including the semiconductor dies with a molding compound;
    forming a mask on a side of the die paddles and the plurality of leads uncovered by the molding compound, the mask having openings exposing a region of the plurality of leads for each unit lead frame that is shared with leads of adjacent ones of the plurality of connected unit lead frames;
    etching the exposed region of the shared leads to separate the shared leads by a gap which extends at least mostly through the shared leads;
    electrolessly plating the side of the die paddles and the plurality of leads uncovered by the molding compound, and sidewalls of sections of the shared leads exposed by the etching;
    after the electroless plating, cutting partly through the molding compound around the periphery of each of the plurality of connected unit lead frames, including below the gap in the shared leads, to electrically isolate the plurality of leads of each unit lead frame from leads of adjacent ones of the plurality of connected unit lead frames; and
    processing the lead frame strip after cutting partly through the molding compound.

2. The method of claim 1, wherein the gap extends completely through the shared leads to physically separate each of the shared leads into at least two different sections.

3. The method of claim 2,
    wherein the molding compound at the bottom of the gap is electrolessly plated prior to cutting partly through the molding compound.

4. The method of claim 1, further comprising:
    cutting completely through the molding compound around the periphery of each of the plurality of connected unit lead frames, including below the gap in the shared leads, to separate the plurality of connected unit lead frames into individual packages after processing the lead frame strip,
    wherein the plating remains intact along the side of the die paddles and the plurality of leads uncovered by the molding compound and along the sidewalls of the sections of the shared lead, after cutting completely through the molding compound.

5. The method of claim 1, further comprising:
    breaking the molding compound around the periphery of each of the plurality of connected unit lead frames, including under the gap in the shared leads, to separate the plurality of connected unit lead frames into individual packages after processing the lead frame strip,
    wherein the plating remains intact along the side of the die paddles and the plurality of leads uncovered by the molding compound and along the sidewalls of the sections of the shared lead, after breaking the molding compound.

6. The method of claim 1, further comprising:
    stopping the etching so that between 1 μm and 5 μm of the shared leads remains intact below the gap upon completion of the etching and prior to cutting partly through the molding compound.

7. The method of claim 1, further comprising:
    forming an etch stop layer on a side of the plurality of leads to be covered by the molding compound, the etch stop layer being resistant to the etching; and
    stopping the etching after the etch stop layer is exposed so that the shared leads remain connected below the gap by the etch stop layer upon completion of the etching and prior to cutting partly through the molding compound.

8. The method of claim 7, wherein the etch stop layer is electrically conductive so that the shared leads remain electrically connected below the gap by the etch stop layer upon completion of the etching and prior to cutting partly through the molding compound.

9. The method of claim 1, further comprising:
    cutting completely through the molding compound around the periphery of each of the plurality of connected unit lead frames, including below the gap in the shared leads, to separate the plurality of connected unit lead frames into individual packages after processing the lead frame strip.

10. The method of claim 1, further comprising:
    breaking the molding compound around the periphery of each of the plurality of connected unit lead frames, including under the gap in the shared leads, to separate the plurality of connected unit lead frames into individual packages after processing the lead frame strip.

11. The method of claim 1, wherein processing the lead frame strip after cutting partly through the molding compound comprises:
    testing one or more groups of the semiconductor dies in parallel.

12. The method of claim 1, wherein groups of the unit lead frames are molded as individual molded units by covering each of the molded units with the molding compound, and wherein processing the lead frame strip after cutting partly through the molding compound comprises:
    removing the molded units from a periphery of the lead frame strip after cutting partly through the molding compound;
    placing the molded units on a support substrate after removal from the periphery of the lead frame strip; and testing one or more groups of the semiconductor dies in parallel after the molded units are placed on the support substrate.

13. A method of processing a lead frame strip including a plurality of connected unit lead frames, each unit lead frame having a die paddle and a plurality of leads connected to a periphery of the unit lead frame, the method comprising:
attaching a semiconductor die to each of the die paddles;
covering the plurality of connected unit lead frames including the semiconductor dies with a molding compound;
forming a mask on a side of the die paddles and the plurality of leads uncovered by the molding compound, the mask having openings exposing a region of the plurality of leads for each unit lead frame that is shared with leads of adjacent ones of the plurality of connected unit lead frames;
etching the exposed region of the shared leads to separate the shared leads by a gap which extends at least mostly through the shared leads;
galvanically plating the side of the die paddles and the plurality of leads uncovered by the molding compound, and sidewalls of sections of the shared leads exposed by the etching;
after the galvanic plating, cutting partly through the molding compound around the periphery of each of the plurality of connected unit lead frames, including below the gap in the shared leads, to electrically isolate the plurality of leads of each unit lead frame from leads of adjacent ones of the plurality of connected unit lead frames; and
processing the lead frame strip after cutting partly through the molding compound.

14. The method of claim 13, wherein the gap extends completely through the shared leads to physically separate each of the shared leads into at least two different sections.

15. The method of claim 13, further comprising:
forming an etch stop layer on a side of the leads to be covered by the molding compound, the etch stop layer being resistant to the etching; and
stopping the etching after the etch stop layer is exposed so that the shared leads remain connected below the gap by the etch stop layer upon completion of the etching and prior to cutting partly through the molding compound.

16. The method of claim 15, wherein the etch stop layer is electrically conductive so that the shared leads remain electrically connected below the gap by the etch stop layer upon completion of the etching and prior to cutting partly through the molding compound.

17. The method of claim 16, further comprising:
galvanically plating the etch stop layer at the bottom of the gap prior to cutting partly through the molding compound.

18. The method of claim 17, wherein cutting partly through the molding compound around the periphery of each of the plurality of connected unit lead frames comprises:
cutting through the plating and the etch stop layer below the gap in the shared leads, to electrically isolate the leads of the unit lead frames.

19. The method of claim 13, wherein groups of the unit lead frames are molded as individual molded units by covering each of the molded units with the molding compound, and wherein processing the lead frame strip after cutting partly through the molding compound comprises:
removing the molded units from a periphery of the lead frame strip after cutting partly through the molding compound;
placing the molded units on a support substrate after removal from the periphery of the lead frame strip; and
testing one or more groups of the semiconductor dies in parallel after the molded units are placed on the support substrate.

20. A method of processing a lead frame strip including a plurality of connected unit lead frames, each unit lead frame having a die paddle and a plurality of leads connected to a periphery of the unit lead frame, the method comprising:
attaching a semiconductor die to each of the die paddles;
covering groups of the unit lead frames including the semiconductor dies with a molding compound to form individual molded units;
forming a mask on a side of the die paddles and the plurality of leads uncovered by the molding compound, the mask having openings exposing a region of the plurality of leads for each unit lead frame that is shared with leads of adjacent ones of the plurality of connected unit lead frames;
etching the exposed region of the shared leads to separate the shared leads by a gap which extends at least mostly through the shared leads;
cutting partly through the molding compound around the periphery of each of the plurality of connected unit lead frames, including below the gap in the shared leads, to electrically isolate the plurality of leads of each unit lead frame from leads of adjacent ones of the plurality of connected unit lead frames;
removing the molded units from a periphery of the lead frame strip after cutting partly through the molding compound;
placing the molded units on a support substrate after removal from the periphery of the lead frame strip; and
testing one or more groups of the semiconductor dies in parallel after the molded units are placed on the support substrate.

* * * * *